United States Patent
Fukushima

(10) Patent No.: US 8,802,188 B2
(45) Date of Patent: *Aug. 12, 2014

(54) METHOD FOR MANUFACTURING MAGNETIC RECORDING MEDIUM, MAGNETIC RECORDING MEDIUM, AND MAGNETIC RECORDING AND REPRODUCING APPARATUS

(75) Inventor: Masato Fukushima, Ichihara (JP)

(73) Assignee: Showa Denko K.K., Tokyo (JP)

( * ) Notice: Subject to any disclaimer, the term of this patent is extended or adjusted under 35 U.S.C. 154(b) by 602 days.

This patent is subject to a terminal disclaimer.

(21) Appl. No.: 12/992,831

(22) PCT Filed: May 11, 2009

(86) PCT No.: PCT/JP2009/059098
§ 371 (c)(1),
(2), (4) Date: Dec. 20, 2010

(87) PCT Pub. No.: WO2009/139477
PCT Pub. Date: Nov. 19, 2009

(65) Prior Publication Data
US 2011/0109992 A1 May 12, 2011

(30) Foreign Application Priority Data
May 15, 2008 (JP) .................. 2008-127816

(51) Int. Cl.
*C23C 14/00* (2006.01)
*G11B 5/39* (2006.01)

(52) U.S. Cl.
CPC ...................... *C23C 14/00* (2013.01)
USPC ............ 427/127; 427/523; 427/526

(58) Field of Classification Search
None
See application file for complete search history.

(56) References Cited

U.S. PATENT DOCUMENTS

| 5,443,901 A * | 8/1995 | Mino et al. .............. 428/336 |
| 6,168,845 B1 | 1/2001 | Fontana, Jr. et al. |
| 6,841,224 B2 | 1/2005 | Kamata et al. |
| 7,067,207 B2 | 6/2006 | Kamata et al. |

(Continued)

FOREIGN PATENT DOCUMENTS

| JP | 05-205257 A | 8/1993 |
| JP | 06-131658 A | 5/1994 |
| JP | 2002-359138 A | 12/2002 |
| JP | 2004-164692 A | 6/2004 |

(Continued)

OTHER PUBLICATIONS

Office Action issued in Japanese Patent Application No. 2008-127816 dated Feb. 5, 2013.

*Primary Examiner* — Mandy Louie
(74) *Attorney, Agent, or Firm* — Sughrue Mion, PLLC

(57) ABSTRACT

The present invention relates to a method for manufacturing a magnetic recording medium having magnetically separated magnetic recording patterns, such a magnetic recording medium, and a magnetic recording and reproducing apparatus. The manufacturing method of the present invention includes: forming a continuous recording layer on a nonmagnetic substrate; then forming, on the recording layer, a mask layer including at least one element selected from the element group of Pt, Ru, and Pd in such a manner that part of the recording layer is not masked; and then performing a magnetic characteristic modifying process including exposing the unmasked part of the surface of the recording layer to reactive plasma or reactive ions produced in the reactive plasma to amorphize the part of the recording layer and to modify the magnetic characteristics of the part, so that magnetically separated magnetic recording patterns are formed.

7 Claims, 2 Drawing Sheets

(56) References Cited

U.S. PATENT DOCUMENTS

| | | |
|---|---|---|
| 7,147,790 B2 | 12/2006 | Wachenschwanz et al. |
| 7,161,753 B2 | 1/2007 | Wachenschwanz et al. |
| 7,549,209 B2 | 6/2009 | Wachenschwanz et al. |
| 2006/0222898 A1* | 10/2006 | Ichihara .................. 428/826 |
| 2007/0116989 A1* | 5/2007 | Ikekame et al. .......... 428/828.1 |
| 2007/0190328 A1* | 8/2007 | Cowburn et al. ............. 428/409 |
| 2009/0201722 A1* | 8/2009 | Giridhar et al. ............... 365/173 |

FOREIGN PATENT DOCUMENTS

| | | |
|---|---|---|
| JP | 2004-178793 A | 6/2004 |
| JP | 2004-178794 A | 6/2004 |
| JP | 2006-209952 A | 8/2006 |
| JP | 2006-309841 A | 11/2006 |
| JP | 2007-213716 A | 8/2007 |
| JP | 2007-329340 A | 12/2007 |
| WO | 2007-108462 A1 | 9/2007 |

\* cited by examiner

METHOD FOR MANUFACTURING MAGNETIC RECORDING MEDIUM, MAGNETIC RECORDING MEDIUM, AND MAGNETIC RECORDING AND REPRODUCING APPARATUS

TECHNICAL FIELD

The present invention relates to a method for manufacturing a magnetic recording medium having magnetically separated magnetic recording patterns and to a magnetic recording medium and a magnetic recording and reproducing apparatus comprising the magnetic recording medium.

BACKGROUND ART

In recent years, the application range of magnetic recording apparatuses such as magnetic disk apparatuses, flexible disk apparatuses, and magnetic tape apparatuses has remarkably increased. As the importance of the above-mentioned magnetic recording apparatuses has increased, the recording density of magnetic recording media for use in these apparatuses has also been remarkably improved. In particular, since MR (Magneto-Resistive) heads and PRML (Partial Response Maximum Likelihood) signal processing techniques were introduced, the surface recording density has been dramatically increased. In recent years, GMR (Giant Magneto Resistive) heads, TMR (Tunneling Magneto Resistive) heads, and the like have also been introduced, and under such circumstances, the recording density has increased at a rate of as much as about 100% per year. The above-mentioned magnetic recording media have been required to have higher recording density, and therefore, magnetic recording layers have been required to have high coercive force, high signal to noise ratio (SNR), and high resolution. In recent years, efforts have also been continued to increase the surface recording density by increasing both the linear recording density and the track density.

The track density of the latest in magnetic recording apparatuses reaches as high as 110 kTPI (tracks per inch). However, the increase in track density is more likely to cause a problem in which pieces of magnetically recorded information interfere with each other between adjacent tracks so that the magnetization transition region at the boundary region becomes a noise source to degrade the SNR. This directly leads to an increase in bit error rate (BER) and therefore becomes a barrier to the improvement of recording density.

To increase the surface recording density, it is necessary to make finer the size of each recording bit on a magnetic recording medium and to make as great as possible the saturation magnetization and magnetic thickness of each recording bit. However, making a recording bit finer causes a problem in which the minimum magnetization volume per bit becomes so small that the recorded data may be lost by thermal fluctuation-induced magnetization inversion.

In addition, since the distance between tracks is reduced, very high accuracy track servo technology is required of magnetic recording apparatuses, and at the same time, the effect between adjacent tracks should be eliminated as much as possible during reproduction. In a method generally used, therefore, recording is performed in a wide area, and reproduction is performed in an area narrower than that for recording. This method can reduce the effect between tracks to the minimum but has a problem in which sufficient reproduction output is difficult to obtain, and therefore sufficient SNR is difficult to ensure.

A method being attempted to solve the problem of thermal fluctuation or ensure high SNR or sufficient output includes forming recesses and protrusions along tracks on the surface of a recording medium to physically separate the recording tracks from one another so that the track density can be increased. Hereinafter, said technique is referred to as a discrete track method, and the magnetic recording medium manufactured by the method is referred to as a discrete track medium.

A known example of the discrete track medium is a magnetic recording medium manufactured by a process including forming a magnetic recording medium on a nonmagnetic substrate having recess and projection patterns on its surface to form a magnetic recording track and a servo signal pattern physically separated from one another.

For example, the magnetic recording medium disclosed in Japanese Patent Application Laid-Open (JP-A) No. 2004-164692 (hereinafter referred to as Patent Document 1) includes a substrate having recesses and protrusions on its surface, a ferromagnetic layer formed on the surface of the substrate with a soft magnetic layer interposed therebetween, and a protective film formed on the surface of the ferromagnetic layer. In this magnetic recording medium, a magnetic recording region that is physically separated from the surroundings is formed at the projection region.

Patent Document 1 discloses that the magnetic recording medium can inhibit the formation of magnetic domain walls in the soft magnetic layer, so that the effect of thermal fluctuation is less likely to be produced and that the interference between the respective recording bits can be prevented, which is effective in reducing record loss or noise caused by the interference between adjacent bits and therefore makes it possible to form a low-noise, high-density, magnetic recording medium.

For example, as disclosed in JP-A No. 2004-178793 (hereinafter referred to as Patent Document 2) and JP-A No. 2004-178794 (hereinafter referred to as Patent Document 3), discrete track methods include a method including forming a magnetic recording medium having several layers of thin films and then forming tracks, and a method including previously forming recess and projection patters directly on the surface of a substrate or on a thin film layer for forming tracks and then forming a thin film of a magnetic recording medium.

Among these methods, the method disclosed in Patent Document 2 is often called a magnetic layer processing type. Since in this method, physical processing is performed on the surface after the medium is formed, this method has the disadvantage that the medium can be easily contaminated during the manufacturing process, and the manufacturing process is very complicated. The latter method is often called an embossing type, in which the medium is hardly contaminated during the manufacturing process, but the recess and projection pattern formed on the substrate is transferred to the film formed, so that a problem occurs in the way that the recording/reproducing head which floats to the medium to perform recording and reproducing may have an unstable floating position or height.

JP-A No. 5-205257 (Patent Document 4), JP-A No. 2006-209952 (Patent Document 5), and JP-A No. 2006-309841. (Patent Document 6) disclose a process that includes forming an inter-recording-track region for a discrete track medium by the step of implanting ions of nitrogen, oxygen or the like into a preformed recording layer (magnetic layer) or applying laser beams to the preformed recording layer to change the magnetic characteristics of the part corresponding to the preformed recording layer, so that the recording track is formed.

In this method, however, the recording layer may be damaged by the ion implantation or laser irradiation, so that recesses and protrusions may be formed on the surface of the recording layer. This method also has a problem in which although the ions being implanted or the laser beams have high energy, the energy density per whole surface of the medium is low, so that a long treatment time is required to change the magnetic characteristics of the whole surface of the medium.

JP-A No. 2002-3591.38 (hereinafter referred to as Patent Document 7) discloses a method for patterning a magnetic material, which includes exposing an exposed part of the surface of a ferromagnetic layer of a magnetic recording medium to halogen-containing reactive gas to fluorinate the ferromagnetic material, so that the ferromagnetic material is converted into a non-ferromagnetic material.

The method disclosed in Patent Document 7 does not involve physical processing of the recording layer and therefore can reduce the contamination during processing of the recording layer. The method also makes it possible to modify the magnetic characteristics of the recording layer in a short time as compared with the case where ion beams or the like are used to modify the magnetic characteristics of the recording layer.

However, it has been found that when the method disclosed in Patent Document 7 is used, a fluoride such as cobalt fluoride is formed around the magnetic recording region and the recording layer of the magnetic recording region is gradually eroded by the fluoride. It has been found that particularly when a material capable of easily forming a compound with reactive plasma is used in a mask layer, the compound can easily diffuse from the mask layer to a magnetic recording region. It has also be found that when a hard disk drive produced with such a magnetic recording medium is used under a high-temperature, high-humidity environment, the magnetic recording/reproducing characteristics degrade over time.

The present invention has been made under the circumstances described above, in which a mask layer stable against reactive plasma is used to prevent it from forming a compound with halogen or the like. An object of the present invention is to provide a method for manufacturing a magnetic recording medium, which can prevent diffusion of a compound from the mask layer by the feature mentioned above and can produce a magnetic recording medium that has high magnetic recording pattern separation performance, is not influenced by signal interference between adjacent patterns, and has magnetic recording/reproducing characteristics improved to be less degraded over time even when it is used under a high-temperature, high-humidity environment and to provide such a magnetic recording medium and a magnetic recording and reproducing apparatus.

DISCLOSURE OF THE INVENTION (1) In order to achieve the above object, the first aspect of the present invention is directed a method for manufacturing a magnetic recording medium having magnetically separated magnetic recording patterns, characterized by including: forming a continuous recording layer on a nonmagnetic substrate; then forming, on the recording layer, a mask layer including at least one element selected from the element group of Pt, Ru, and Pd in such a manner that part of the recording layer is not masked; and then performing a magnetic characteristic modifying process including exposing the unmasked part of the surface of the recording layer to reactive plasma or reactive ions produced in the reactive plasma to amorphize the part of the recording layer, so that the magnetic characteristics of the part is modified, wherein magnetically separated magnetic recording patterns are formed by the magnetic characteristic modifying process.

(2) The second aspect of the present invention is directed the method for manufacturing a magnetic recording medium according to the first aspect of the invention, characterized in that the magnetization of the recording layer modified by the magnetic characteristic modifying process is 75% or less of the original magnetization.

(3) The third aspect of the present invention is directed the method for manufacturing a magnetic recording medium according to the first or second aspect of the invention, characterized in that the reactive plasma contains oxygen ions produced by introducing oxygen gas.

(4) The fourth aspect of the present invention is directed the method for manufacturing a magnetic recording medium according to any one of the first to third aspects of the invention, characterized in that the reactive plasma contains halogen and halide ions.

(5) The fifth aspect of the present invention is directed the method for manufacturing a magnetic recording medium according to the fourth aspect of the invention, characterized in that the part of the recording layer exposed to halogen and halide ions is substantially free of a halide of a material that forms the recording layer.

(6) The sixth aspect of the present invention is directed the method for manufacturing a magnetic recording medium according to the fourth or fifth aspect of the invention, characterized in that the reactive plasma contains oxygen and oxygen ions and halogen and halide ions.

(7) The seventh aspect of the present invention is directed the method for manufacturing a magnetic recording medium according to any one of the fourth to sixth aspects of the invention, characterized in that the magnetic characteristic modifying process includes: a first step of exposing the unmasked part of the surface of the recording layer to reactive plasma containing oxygen and oxygen ions; and a second step of then exposing the unmasked part to reactive plasma containing halogen and halide ions.

(8) The eighth aspect of the present invention is directed the method for manufacturing a magnetic recording medium according to any one of the first to seventh aspects of the invention, further including implanting ions into the unmasked part of the surface of the recording layer before the magnetic characteristic modifying process.

(9) The ninth aspect of the present invention is directed the method for manufacturing a magnetic recording medium according to the eighth aspect of the invention, characterized in that the implanted ions has a composition only consisting of one kind of ion or two kinds ions of argon and nitrogen ions.

(10) The tenth aspect of the present invention is directed the method for manufacturing a magnetic recording medium according to any one of the fourth to ninth aspects of the invention, characterized in that the halide ions are formed by introducing at least one halogen gas selected from the group of $CF_4$, $SF_6$, $CHF_3$, $CCl_4$, and KBr into reactive plasma.

(11) The eleventh aspect of the present invention is directed the method for manufacturing a magnetic recording medium according to any one of the fourth to ninth aspects of the invention, characterized in that the halide ions are F ions.

(12) The twelfth aspect of the present invention is directed a magnetic recording medium characterized by being manufactured by the method for manufacturing a magnetic recording medium according to any one of the first to eleventh aspects of the invention.

(13) The thirteenth aspect of the present invention is directed a magnetic recording and reproducing apparatus, including a magnetic recording medium and a magnetic head for performing recording and reproducing information on the magnetic recording medium, characterized in that the magnetic recording medium is according to the twelfth aspect of the invention.

In the first to eleventh aspects of the present invention recited in the above items (1) to (11), a material including at least one element selected from the element group of Pt, Ru, and Pd is used to form the mask layer. Therefore, the mask layer is stable against reactive plasma containing halogen ions or the like and does not form a compound with halogen or the like. Thus, diffusion of a compound from the mask layer is prevented, so that magnetic recording patterns with no image blurring can be formed. Therefore, the magnetic recording medium manufactured according to the present invention has high magnetic recording pattern separation performance, is not influenced by signal interference between adjacent patterns, and has high recording density characteristics. Using the manufacturing method of the present invention, such a magnetic recording medium with high recording density characteristics can be manufactured with high productivity.

The manufacturing method of the present invention makes it possible to prevent diffusion of a compound from the mask layer. Therefore, the magnetic recording medium manufactured according to the present invention has high surface smoothness and can be used in a magnetic recording and reproducing apparatus in which a low floating height of magnetic head is realized.

As compared with conventional media, the magnetic recording medium of the present invention has improved magnetic recording/reproducing characteristics, which are less degraded over time, even when the medium is used under a high-temperature, high-humidity environment. Therefore, the magnetic recording and reproducing apparatus having the magnetic recording medium of the present invention can be stably used even in high-temperature, high-humidity environment applications such as car navigation applications.

BEST MODE FOR CARRYING OUT THE INVENTION

Figure 1:
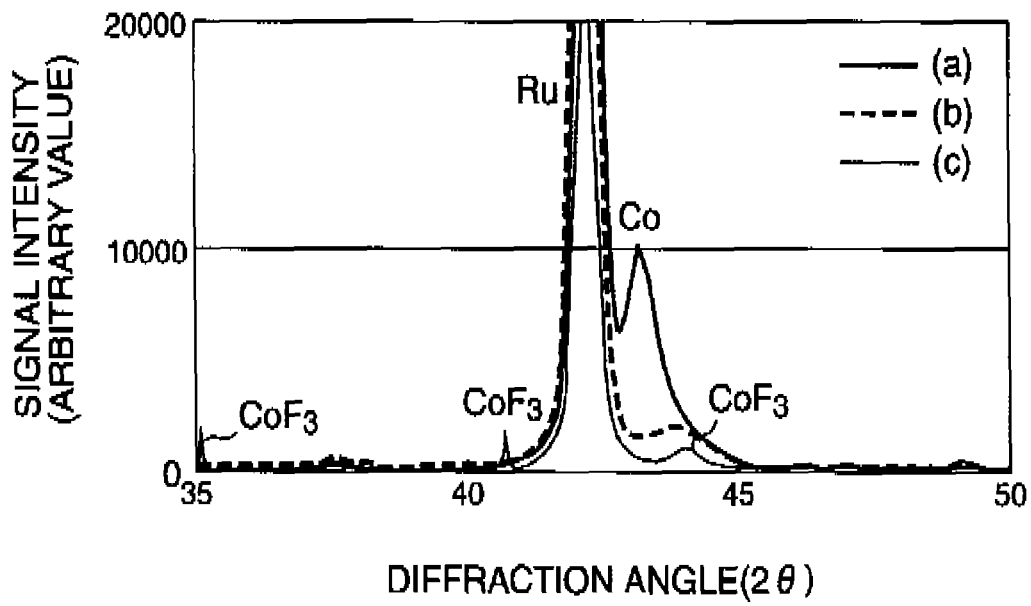
FIG. 1 is a graph showing the result of X-ray diffraction of a product of the reaction between a 70Co-5Cr-15Pt-10SiO$_2$ magnetic alloy and reactive plasma produced with CF$_4$.

Embodiments of the present invention are described in detail below.

The method of the present invention for manufacturing a magnetic recording medium having magnetically separated magnetic recording patterns is characterized by including: forming a continuous recording layer on a nonmagnetic substrate; then forming, on the recording layer, a mask layer including at least one material selected from the group of Pt, Ru, and Pd; and then performing a magnetic characteristic modifying process including exposing the unmasked part of the surface of the recording layer to reactive plasma or reactive ions produced in reactive plasma to amorphize the part of the recording layer and to modify the magnetic characteristics of the unmasked part, so that magnetically separated magnetic recording patterns are formed.

The mask layer used in the manufacturing method of the present invention may be typically made only of a single element selected from the element group consisting of Pt, Ru, and Pd. Alternatively, the mask layer may be formed using an alloy including two or three elements from the element group consisting of Pt, Ru, and Pd.

The composition of the mask layer preferably consists only of one or more selected from the element group consisting of Pt, Ru, and Pd, and the composition of the mask preferably does not contain any other element than these three elements, because such any other element may act as an impurity.

In the manufacturing method of the present invention, the surrounding recording layer to form magnetic recording patterns is exposed to reactive plasma or ionized components in reactive plasma so that the exposed part of the recording layer is amorphized to form a magnetic recording medium. When the recording layer is exposed to reactive ions or the like, an ionization product of the magnetic alloy is formed at the exposed part of the recording layer. For example, as described in Patent Document 7, when a Co-based magnetic alloy is exposed to fluoride ion plasma, the exposed part of the Co-based magnetic alloy is converted into nonmagnetic cobalt fluoride. This is because the ions in the reactive plasma are highly reactive so that they easily react with the magnetic alloy or the like. The method of the present invention for manufacturing a magnetic recording medium is not characterized in that the recording layer exposed to reactive ions or the like is made nonmagnetic by converting the magnetic alloy into a nonmagnetic product by reaction between ions and the magnetic alloy of the recording layer but characterized in that the magnetic alloy is amorphized so that it is made nonmagnetic.

In the present invention, the process of forming magnetic recording patterns includes exposing the region around the patterned part to ionized components in reactive plasma so that the corresponding part is amorphized. The manufacturing method of the present invention is characterized in that when the recording layer is amorphized, a material including at least one element selected from the group consisting of Pt, Ru, and Pd is used in the mask layer of the patterned part. The reason for this feature is as mentioned above that if a material capable of easily forming a compound with reactive plasma is used in the mask layer, the compound can diffuse into the magnetic recording patterns so that a compound with the recording layer can also be formed. It has been revealed that particularly when halogen-containing plasma is used as the reactive plasma, the material of the mask layer is converted into a halide, from which halide ions diffuse into the magnetic recording patterns to form a halide in the recording layer.

In the manufacturing method of the present invention, a material consists of one or more elements selected from the group consisting of Pt, Ru, and Pd is used in the mask layer. The material consisting of one or more of these elements is stable against reactive plasma containing halide ions or the like and does not form a compound with halogen or the like. In the present invention, based on such a mechanism, diffusion of a compound from the mask layer is prevented so that magnetic recording patterns with no image blurring can be formed.

The method for amorphizing the part of the magnetic alloy by reaction between the magnetic alloy and reactive plasma may be a method that includes allowing ions in reactive plasma to collide with the magnetic alloy to physically destroy the structure of the part of the magnetic alloy.

Besides the above, another amorphization method that may be used includes allowing ions in reactive plasma to react with the magnetic alloy to form an ionization product of the magnetic alloy and then eliminating only the compound produced by the ionization of the magnetic alloy. For example, a Co-based magnetic alloy may be exposed to reactive fluoride ions to form nonmagnetic cobalt fluoride, and then the cobalt fluoride may be heated under vacuum at a temperature of 100° C. or less for about 10 seconds, so that only fluorine is eliminated and that an amorphous Co-based alloy is formed as a result of the destruction of the crystal structure.

The conditions for the production of such an amorphous magnetic alloy may be determined by appropriately determining the composition of the magnetic alloy, the type of ions in the reactive plasma, the pressure for the reaction, the reaction time, the temperature, or the like. In a reactor, the amorphization of the magnetic alloy can be performed under a plasma pressure controlled in the range from $1 \times 10^{-3}$ Pa to atmospheric pressure. In particular, the amorphization is preferably performed under conditions where the flow rate of the reactive gas is controlled to produce a plasma pressure of around 1 Pa.

For example, FIG. 1 shows the result of X-ray diffraction of a product of the reaction between a 70Co-5Cr-15Pt-10SiO$_2$ magnetic alloy of the recording layer and reactive plasma produced with CF$_4$. In the drawing, the diffraction intensity curve (a) represented by the solid line shows the result of diffraction of the recording layer before the reaction with the reactive plasma. The large signal at a diffraction angle of about 42° is a diffraction peak of a Ru intermediate layer under the recording layer, and the signal at about 43° is a diffraction peak of Co in the magnetic alloy.

In the drawing, the diffraction intensity curve (b) represented by the dotted line shows the result of X-ray diffraction of the recording layer obtained after exposing it to fluoride ion-containing reactive plasma for 60 seconds. The treatment conditions is that CF$_4$ and O$_2$ were used at rates of 10 cc/minute and 90 cc/minute, respectively, the plasma was generated by applying a power of 200 W, and the pressure in the reactor and the substrate bias power were set at 0.5 Pa and 200 W, respectively. During the treatment, the substrate temperature was about 150° C. After the reaction, the peak at about 43° disappeared, but any peak derived from cobalt fluoride did not appear. The peak of the Ru intermediate layer at about 42° did not change. This result indicates that the Co-based magnetic alloy lost crystallinity and became amorphous.

In the drawing, the diffraction intensity curve (c) represented by the thin solid line also shows the result of X-ray diffraction of the recording layer obtained when the recording layer (the recording layer shown by the diffraction intensity curve (a)) was exposed to fluoride ion-containing reactive plasma.

However, the diffraction intensity curve (c) shows the result of the treatment of the recording layer under the same conditions as those for the diffraction intensity curve (b), except that the substrate bias was not applied and that only CF$_4$ was used without addition of oxygen to the treatment gas. In the diffraction intensity curve (c), the peak at about 43° disappears, and the Ru intermediate layer peak at about 42° does not change, but peaks derived from cobalt fluoride appears at about 35°, 41°, and 44°.

According to the inventors' study, the method described below may be used to control the halogenation or the amorphization of the magnetic alloy in the process of modifying the recording layer with halide ion-containing reactive plasma.

(1) The application of a bias voltage to the substrate can facilitate the amorphization of the recording layer. This may be because in the recording layer, the destruction of the crystal structure by the impact of halide ions is allowed to proceed more easily than the halogenation reaction with halide ions, when a bias voltage is applied.

(2) When the halogen in the reactive plasma is in the form of radicals, the halogenation of the magnetic grains in the recording layer proceeds easily. When the halogen in the reactive plasma is in the form of ions, the amorphization of the magnetic grains proceeds easily. This may be because there is generated a difference in the reactivity between the halogen and the magnetic grains due to the condition of the halogen atom.

(3) When CF$_4$ is used as halogen-containing gas, the halogenation of the magnetic grains proceeds easily. When SF$_6$ is used, the amorphization proceeds easily. This may be because of the characteristics of the halogen gas.

(4) When oxygen is added to the reactive plasma, the amorphization of the magnetic grains proceeds easily. This may be because the oxidation of the magnetic grains more easily proceeds than the halogenation of the magnetic grains.

(5) When the recording layer has a granular structure containing oxides at grain boundaries, the halide ion reaction proceeds from the oxides, so that the halogenation of the magnetic particles in the recording layer is less likely to proceed.

In the present invention, the magnetic recording patterns include a so-called patterned medium having magnetic recording patterns arranged with certain regularity per bit, a medium having magnetic recording patterns arranged in the form of tracks, or other patterns such as servo signal patters.

In the present invention, the method of the present invention is preferably used to manufacture a so-called discrete magnetic recording medium having magnetic recording tracks and servo signal patterns as the magnetically separated magnetic recording patterns, in view of the simplicity of the manufacturing process.

The present invention is described in detail below with respect to a discrete magnetic recording medium as an example.

Figure 2:
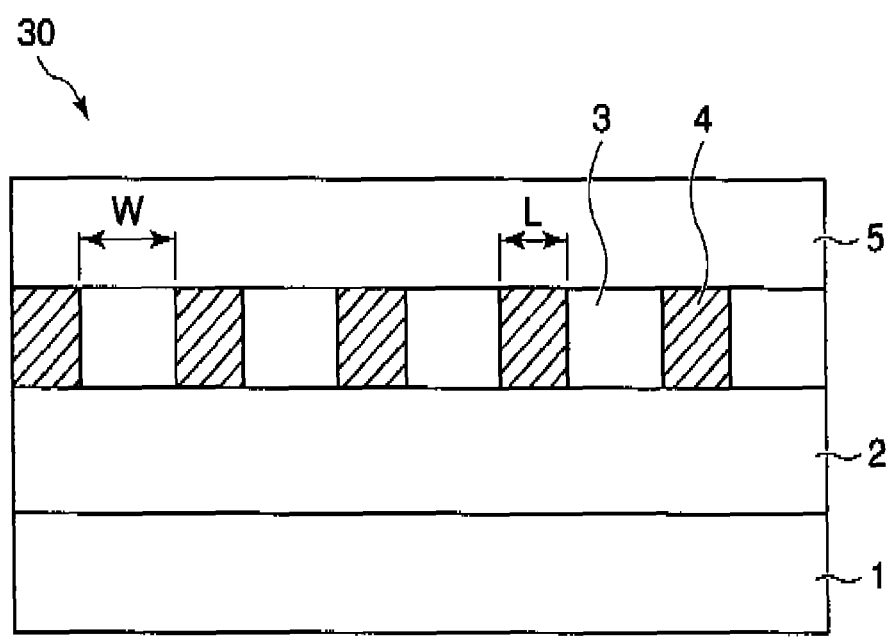
FIG. 2 is a diagram illustrating the cross-sectional structure of a discrete magnetic recording medium according to the present invention.

FIG. 2 illustrates the cross-sectional structure of a discrete magnetic recording medium according to the present invention. A magnetic recording media 30 according to the present invention has a structure that includes a nonmagnetic substrate 1, and a layer 2 including a soft magnetic layer and an intermediate layer, a magnetic region 3 having magnetic patterns, a nonmagnetic layer 4, and a protective film 5, which are formed on the surface of the nonmagnetic substrate 1, and also includes a lubricating film (not shown) formed on the uppermost surface. The uppermost layer of magnetic region 3 serves as a recording layer.

For high recording density, the width w of the magnetic part of the magnetic region 3 having magnetic patterns is preferably 200 nm or less, and the width L of the nonmagnetic part of the nonmagnetic layer 4 is preferably 100 nm or less. The width W of the magnetic part and the width L of the nonmagnetic part each has no particular lower limit and are each preferably made as fine as physically possible. Therefore, the track pitch P (=W+L) should be as narrow as possible in the range of 300 nm or less so that the recording density can be increased.

The nonmagnetic substrate 1 to be used in the present invention may be of any type such as an Al alloy substrate including Al as a main component, such as an Al—Mg alloy substrate, or a substrate made of general soda glass, aluminosilicate-based glass, crystallized glasses, silicon, titanium, ceramics, or any of various resins. In particular, an Al alloy substrate, a glass substrate such as a crystallized glass substrate, or a silicon substrate is preferably used. These substrates preferably have an average surface roughness (Ra) of 1 nm or less, more preferably 0.5 nm or less, particularly preferably 0.1 ma or less.

The recording layer including the uppermost layer of the magnetic region 3 formed on the surface of the nonmagnetic substrate as described above may be an in-plane recording layer or a perpendicular recording layer. To achieve higher recording density, the recording layer is preferably a perpendicular recording layer. These magnetic regions are preferably made of an alloy including Co as a main component.

For example, the magnetic region for use in an in-plane magnetic recording medium may be a layered structure including a nonmagnetic CrMo underlayer and a ferromagnetic CoCrPtTa recording layer.

For example, the magnetic region for use in a perpendicular magnetic recording medium may be a laminate of: a backing layer including a soft magnetic FeCo alloy (such as FeCoB, FeCoSiB, FeCoZr, FeCoZrB, or FeCoZrBCu) FeTa alloy (such as FeTaN or FeTaC), or Co alloy (such as CoTaZr, CoZrNB, or CoB); an orientation control film of Pt, Pd, NiCr, NiFeCr, or the like; an as-needed optional intermediate film of Ru or the like; and a recording layer including a 60Co-15Cr-15Pt alloy or a 70Co-5Cr-15Pt-10SiO$_2$ alloy.

The recording layer including the uppermost layer may have a thickness of 3 nm to 20 nm, preferably 5 nm to 15 nm. The recording layer may be so formed that sufficient head output and input can be obtained depending on the type of the magnetic alloy used and the layered structure. The thickness of the recording layer should be formed at a certain level or more so that at least a certain level of output can be obtained during reproduction. On the other hand, the thickness of the recording layer should be set at an optimum level, because the recording layer parameters representing the record and reproduction characteristics generally degrade as the head output increases.

The recording layer is generally formed as a thin film by a sputtering technique.

The present invention is characterized in that the region having a magnetic recording track and a servo signal pattern which are magnetically separated from one another is formed by a process that includes exposing the previously formed recording layer to reactive plasma to amorphize the exposed part of the recording layer so that the magnetic characteristics of the corresponding part is modified.

The modification of the magnetic characteristics of the recording layer specifically means alteration of the coercive force, residual magnetization, or other characteristics of the recording layer. The term "alteration of the coercive force, residual magnetization, or other characteristics of the recording layer" is intended to include a reduction in the coercive force or a reduction in the residual magnetization.

In the present invention, the magnetization magnitude or coercive force of the exposed part of the recording layer should be ideally reduced to 0% particularly by the modification of the magnetic characteristics by exposure to reactive plasma. Actually, however, the method to be used can preferably reduce the magnetization magnitude of the recording layer to 75% or less, more preferably 50% or less of the original magnetization magnitude, or preferably reduce the coercive force to 50% or less, more preferably 20% or less of the original coercive force. When a discrete track magnetic recording medium is manufactured using such a method, diffusion of a compound from the mask layer can be prevented, so that a magnetic recording medium having a high in-plane recording density and prevented from causing write blurring during magnetic recording thereon can be provided.

In the present invention, the part having a magnetic recording track and a servo signal pattern magnetically separated from one another is formed by exposing the previously formed recording layer to reactive plasma so that the recording layer can be amorphized.

In the present invention, amorphizing the recording layer means the atomic arrangement of the recording layer is changed into an irregular atomic arrangement with no long range order. More specifically, amorphizing the recording layer means that the recoding layer is changed into a state where fine crystal grains of 2 nm or less are randomly arranged. Such a random atomic arrangement can be confirmed by an analytical technique, when any peak indicating a crystal plane is not observed by X-ray diffraction or electron beam diffraction and when only a halo (broad signal) is observed.

Examples of reactive plasma suitable for use in the manufacturing method of the present invention include inductively coupled plasma (ICP) and reactive ion plasma (RIE).

The inductively coupled plasma is high-temperature plasma which may be obtained by a process that includes applying a high voltage to gas to convert the gas into plasma and generating eddy-current-induced Joule heat in the plasma by the application of a high-frequency, variable magnetic field. The inductively coupled plasma has a high electron density and can modify the magnetic characteristics of a recording layer with a larger area at higher efficiency, as compared with conventional ion beams used in the manufacture of discrete track media.

The reactive ion plasma is highly reactive plasma, which contains reactive gas such as $O_2$, $SF_6$, $CF_4$, or $CCl_4$ in plasma. In an embodiment of the present invention, such plasma may be used as the reactive plasma, so that the magnetic characteristics of the recording layer can be modified with higher efficiency.

In the manufacturing method of the present invention, the recording layer formed is modified by exposure of it to reactive plasma. The modification of the recording layer is preferably achieved by reaction between the magnetic metal of the recording layer and atoms or ions in the reactive plasma. The "reaction between the magnetic metal and the reactive plasma" is exemplified by alteration of the crystal structure of the magnetic metal by intrusion of atoms or other species into the magnetic metal from the reactive plasma, alteration of the composition of the magnetic metal, oxidation of the magnetic metal, nitriding of the magnetic metal, or siliciding of the magnetic metal.

In the present invention, particularly oxygen atoms are added to the reactive plasma, and the recording layer is oxidized by reaction between the magnetic metal of the recording layer and oxygen atoms or oxygen ions in the reactive plasma. This is because when the recording layer is partially oxidized, the residual magnetization and the coercive force of the oxidized part can be efficiently reduced. This makes it possible to reduce the reactive plasma treatment time in the manufacture of a magnetic recording medium having magnetically separated magnetic recording patterns. In addition, oxygen atoms or oxygen ions contained in the reactive plasma can facilitate the amorphization of the recording layer.

In the present invention, the reactive plasma preferably contains halogen atoms or halogen ions. In particular, fluorine F) atoms are preferably used as the halogen atoms. The halogen atoms may be added together with or without oxygen atoms to the reactive plasma. As described above, when oxygen atoms or the like are added to the reactive plasma, oxygen atoms or the like can react with the magnetic metal of the recording layer to modify the magnetic characteristics of the recording layer. In this process, halogen atoms or halogen ions may be added to the reactive plasma, so that the reactivity can be further increased.

Even when no oxygen atoms are added to the reactive plasma, the halogen atoms can also react with the magnetic alloy to modify the magnetic characteristics of the recording layer. Although the reason for this mechanism is not clear in detail, it is considered that the halogen atoms in the reactive plasma can etch the foreign material deposited on the surface of the recording layer, so that the surface of the recording layer can be cleaned, which increases the reactivity of the recording layer. It is also considered that the cleaned surface of the recording layer can react with the halogen atoms with high efficiency. In particular, F atoms are preferably used as the halogen atoms having such the above-mentioned effect.

In the manufacturing method of the present invention, the process including partially exposing the surface of the recording layer to reactive plasma to modify the magnetic characteristics of the exposed part of the recording layer (magnetic characteristic modifying process) is preferably performed using a first step of exposing the recording layer to oxygen-containing plasma and then a second step of exposing the recording layer to halogen-containing plasma. The use of the first and second steps makes it possible to increase the speed of the modification of the magnetic characteristics of the recording layer and to efficiently reduce the residual magnetization and coercive force of the recording layer. According to the inventors' study, the reason for this effect is as described below.

First, when the recording layer is exposed to oxygen-containing plasma, the grain boundary portions of the magnetic particles are preferentially oxidized, and the oxidized region extends in the thickness direction along the grain boundaries.

Thereafter, when the recording layer is exposed to halogen-containing plasma, the oxidized region at the boundaries of the magnetic particles preferentially reacts with the halogen so that the crystal structure of the oxidized region at the boundaries is destroyed and that the reaction region extends from the grain boundaries to the magnetic particles. Based on the above-mentioned mechanism and effect, the magnetic characteristics of the recording layer can be modified at high speed, as compared with the case where the recording layer is simply exposed to oxygen plasma or halogen plasma, and the reaction between the magnetic particles and halogen also efficiently proceeds, so that the residual magnetization and coercive force of the recording layer can be efficiently reduced.

In the first and second steps, different types of ions are used to form the reactive plasma, respectively. In the reactor, however, both steps can be performed under a plasma pressure controlled in the range from $1 \times 10^{-3}$ Pa to atmospheric pressure. Each step is also preferably performed under conditions where the flow rate of the reactive gas is controlled to produce a plasma pressure of around 1 Pa.

In the present invention, the step of implanting ions into part of the surface of the recording layer is preferably performed before the magnetic characteristic modifying process. When this step is performed, the magnetic characteristics of the recording layer can be modified at higher speed. According to the inventors' study, this is because the ion implantation into part of the surface of the recording layer can activate the surface of the recording layer, so that the recording layer can have higher reactivity with plasma in the step of exposing the recording layer to the reactive plasma, which is performed thereafter.

In the ion implantation step, ions are preferably implanted into a region from the surface to a depth of about 1 nm in the unmasked surface part of the recording layer.

In the present invention, inert ions such as argon or nitrogen ions are preferably used as the ions to be implanted into the recording layer. This is because such inert ions are less likely to have an adverse effect on the reaction between the recording layer and the reactive plasma, which is performed thereafter. The composition of ions to be used in the implantation into the recording layer is preferably controlled so that argon or nitrogen ions with a purity of 100% can be provided.

A magnetic recording medium according to the present invention is preferably produced by a process for manufacturing a magnetic recording medium, which includes: performing the step of forming, on the surface of the recording layer, a mask layer corresponding to the magnetic recording pattern; then treating the surface with reactive plasma; then removing the mask layer and forming a protective layer again; and then applying a lubricant. When such a process is used, the reactivity between the recording layer and the reactive plasma can be further enhanced.

A magnetic recording medium according to the present invention is also preferably produced by a process including: forming a protective layer on the recording layer; forming, on the surface, a mask layer corresponding to the magnetic recording pattern; and then performing recording layer-modifying treatment with reactive plasma. When the above-mentioned process is used, there is no need to form a protective film after the reactive plasma treatment, so that the manufacturing process becomes simple and that the effects of improving the productivity and reducing the contamination during the process of manufacturing the magnetic recording medium are obtained. The inventors have confirmed by experiments that even after a protective film is formed on the surface of the recording layer, the recording layer can be allowed to react with reactive plasma. Concerning the reason why the recording layer covered with the protective film can react with reactive plasma, the inventors have speculated that the protective film has pores or the like, through which reactive ions in the plasma enters to react with the magnetic metal. Another reason may be that the reactive ions can diffuse through the protective film and reach the recording layer. The protective layer may be formed to be placed over the top surface of the recording layer, and the protective layer does not have to be formed in such a manner that it corresponds to the magnetic recording pattern.

The mask layer may be pattered as described below.

First, a continuous mask layer is formed on the recording layer or the protective film formed subsequently to the recording layer.

A resist is then applied thereto, and the resist is patterned by pressing a stamper directly and tightly against the resist at high pressure.

The part not covered with the resist is then removed from the mask layer, so that a patterned mask layer is formed. Alternatively, the patterning may be performed using a conventional photolithographic technique. A thermosetting resin, an ultraviolet-curable resin, a spin-on-glass (SOG) film, or the like may be used as the resist.

For example, the stamper used in the above process may be a metal plate on which a fine track pattern is formed using an electron beam drawing technique or the like. The stamper material is required to have such hardness and durability that the stamper can withstand the process. Ni or the like is typically used, while any material that can achieve the above-mentioned object may be used. Besides the track for recording usual data, servo signal patterns such as a burst pattern, a gray cord pattern, and a preamble pattern may also be formed on the stamper.

After the reactive plasma treatment, the resist may be removed using dry etching, reactive ion etching, ion milling, wet etching, or any other appropriate technique.

The method of forming the protective film 5 is generally, but not limited to, a method of forming a diamond-like carbon thin film by P-CVD or the like.

The protective film may be formed using a general protective film material such as carbon (C) for a diamond film or the like, hydrocarbon ($H_xC$), carbon nitride (CN), amorphous carbon, silicon carbide (SiC), or the like for a carbonaceous layer, $SiO_2$, $Zr_2O_3$, or TiN. The protective film may also be composed of two or more layers.

The thickness of the protective film 5 should be less than 10 nm. This is because if the protective film has a thickness of more than 10 nm, the distance between the head and the recording layer may be so large that input/output signal with sufficient intensity cannot be obtained.

A lubricating layer is preferably formed on the protective film. Examples of a lubricant used for the lubricating layer include a fluorine-containing lubricant, a hydrocarbon-based lubricant, and a mixture thereof. A lubricating layer with a thickness of 1 to 4 nm is generally formed.

Figure 3:
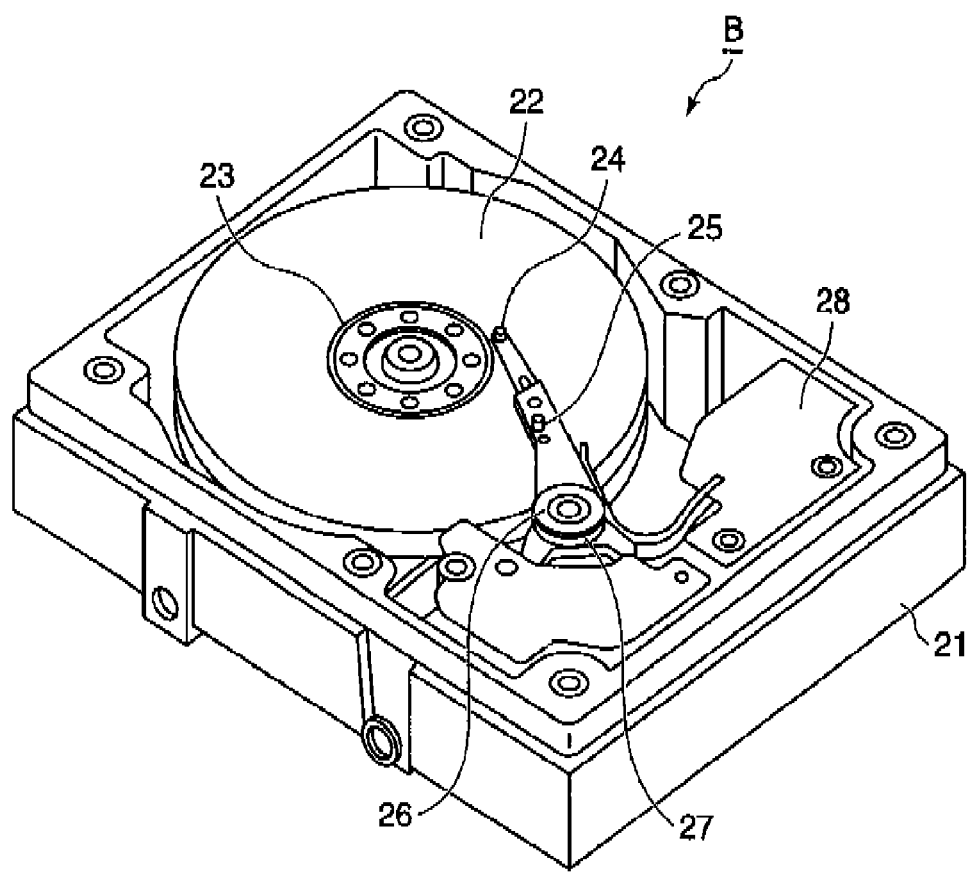
FIG. 3 is a perspective view showing an example of the magnetic recording and reproducing apparatus according to the present invention.

FIG. 3 shows the structure of a magnetic recording and reproducing apparatus according to the present invention. The magnetic recording and reproducing apparatus B according to the present invention includes a rectangular box-shaped case 21 having an opening on the upper side and a top cover (not shown) with which the opening of the case 21 is closed. In the case 21, there are housed a magnetic recording medium 22 having the same structure as the magnetic recording medium 30 described above, a spindle motor 23 serving as driving means for supporting and rotating the magnetic recording medium 22, a magnetic head 24 for performing recording and reproducing of magnetic signals on the magnetic recording medium 22, a head actuator 25 having a suspension whose front end holds the magnetic head 24 and movably supporting the magnetic head 24 relative to the magnetic recording medium 22, a rotary shaft 26 rotatably supporting the head actuator 25, a voice coil motor 27 for rotating and positioning the head actuator 25 through the rotary shaft 26, and a head amp circuit 28.

In conventional technology, the reproducing head width is made narrower than the recording head width so that the influence of the magnetization transition region of the track edge part can be eliminated. In the present invention, however, the recording tracks of the magnetic recording medium are made magnetically discontinuous, so that the reproducing head width and the recording head width can be set almost the same and the apparatus B can be operated. Therefore, the magnetic recording medium of the present invention can provide a sufficient level of reproduction output and a high SNR.

In addition, the reproducing part of the magnetic head may comprise a GMR head or a TMR head. In this case, even when the magnetic recording medium 22 having a high recording density is used, a sufficient level of reproduction signal intensity can be obtained from the magnetic recording medium 22. According to the present invention, therefore, a magnetic recording apparatus with a high recording density can be achieved. In addition, the magnetic head can float to a height of 0.005 μm to 0.020 μm, which is smaller than the conventional height, so that an increased output and a high SNR can be obtained. According to the present invention, therefore, a magnetic recording apparatus with large capacity and high reliability can be provided.

A combination of signal processing circuits based on maximum likelihood decoding can further increase the recording density. For example, a satisfactory level of SNR can be obtained, even when recording and reproducing are performed at a track density of 100 k tracks/inch or mere, a linear recording density of 1,000 k bits/inch or more, or a recording density of 100 G bits per square inch or more.

EXAMPLES

The present invention is specifically described by the examples below, but not limited to the examples. (Examples 1 to 4 and Comparative Examples 1 to 15)

Magnetic recording media of Examples 1 to 4 and Comparative Examples 1 to 15 shown in Table 1 were manufactured as described below.

First, a glass substrate for HD was placed in a vacuum chamber, and the vacuum chamber was previously evacuated to $1.0×10^{-5}$ Pa or less. The glass substrate used was made of crystallized glass, which was composed of $Li_2Si_2O_5$, $Al_2O_3$—$K_2O$, $Al_2O_5$—$K_2O$, MgO—$P_2O_5$, and $Sb_2O_3$—ZnO, and had an outer diameter of 65 mm, an inner diameter of 20 mm, and an average surface roughness (Ra) of 2 Å (0.2 nm).

A soft magnetic layer of FeCoB, an intermediate layer of Ru, and a recording layer of 70Co-5Cr-15Pt-10SiO$_2$ alloy were stacked on the glass substrate by DC sputtering. The thicknesses of the FeCoB soft magnetic layer, the Ru intermediate layer, and the recording layer were 600 Å, 100 Å, and 150 Å, respectively. A mask layer was formed on the surface thereof. The magnetic recording media of Examples 1 to 4 and Comparative Examples 1 to 15 shown in Table 1 were manufactured under the same manufacturing conditions as described above, except for material used to form the mask layer.

As shown in Table 1, Pt was used to form the mask layer in Example 1. Ru, Pd, and Pt$_{50}$Ru were used to form the mask layer in Examples 2, 3, and 4, respectively. Ta in Comparative Example 1, W in Comparative Example 2, Si in Comparative Example 3, SiO$_2$ in Comparative Example 4, Ta$_2$O$_3$ in Comparative Example 5, Re in Comparative Example 6, Mo in Comparative Example 7, Ti in Comparative Example 8, V in Comparative Example 9, Nb in Comparative Example 10, Sn in Comparative Example 11, Ga in Comparative Example 12, Ge in Comparative Example 13, As in Comparative Example 14, and Ni in Comparative Example 15 were used to form the mask layer, respectively. The thickness of the mask layer was 50 Å in all of Examples 1 to 4 and Comparative Examples 1 to 15.

An ultraviolet-curable resin was applied with a thickness of 200 nm to the surface of the mask layer of each of the examples and the comparative examples, and imprinting was performed thereon using a Ni stamper previously prepared. The stamper had a track pitch of 100 nm and a groove depth of 20 nm. Ion milling was performed on the surface of the mask layer of each of the examples and the comparative examples, and the part not covered with the ultraviolet curable resin was removed from the mask layer, so that the mask layer of each of the examples and the comparative examples was patterned.

The surface of the mask layer of each of the examples and the comparative examples was exposed to reactive plasma, so that the unmasked part of the recording layer was modified. Reactive plasma treatment was performed on each recording layer using an inductively-coupled plasma system NE550 (ULVAC, Inc.). The gas and conditions used in the production of plasma were as follows. $CF_4$ and $O_2$ were used at rates of 10 cc/minute and 90 cc/minute, respectively, the plasma was generated by applying a power of 200 W, and the pressure in the reactor and the substrate bias power were set at 0.5 Pa and 200 W, respectively. Under the conditions, the surface of the magnetic recording medium was treated for 60 seconds. With respect to each of the examples and the comparative examples, the reactive plasma-treated part of the recording layer was examined by X-ray diffraction. As a result, the signal derived from Co disappeared, and any signal derived from cobalt fluoride was not observed.

This showed that the reactive plasma-treated part of the recording layer had an amorphous structure with respect to all of the examples and the comparative examples.

Subsequently, the mask layer was removed by dry etching. A carbon protective film was formed on the surface thereof, and finally, a fluorine-containing lubricating film was applied thereto, so that the manufacture of the magnetic recording medium of each of the examples and the comparative examples shown in Table 1 was completed.

The magnetic recording medium of each of the examples and the comparative examples shown in Table 1 and manufactured by the method described above was measured for electromagnetic conversion characteristics including coercive force and SNR. The evaluation of the electromagnetic conversion characteristics was performed using spin stand testing. The heads used for the evaluation were a perpendicular recording head for recording and a TuMR head for reading, and SNR values were measured when 750 kFCI (Flux Change per Inch) signal was recorded. Table 1 shows the results of measurement of the electromagnetic conversion characteristics of Examples 1 to 4 and Comparative Examples 1 to 15.

[Evaluation of Temporal Change of the Electromagnetic Conversion Characteristics of the Magnetic Recording Medium]

The magnetic recording medium of each of the examples and the comparative examples in Table 1. was stored under an environment with a temperature of 80° C. and a humidity of 80% in an oven for 720 hours. Thereafter, it was measured how the coercive force and SNR of the magnetic recording medium changed. Table 1 also shows the results of measurement of the electromagnetic conversion characteristics of Examples 1 to 4 and Comparative Examples 1 to 15 after the high-temperature, high-humidity treatment. In Table 1, the "temporal change of coercive force" is indicated by a percentage value obtained by dividing the coercive force difference between before and after the high-temperature, high-humidity treatment by the coercive force before the high-temperature treatment with respect to each of the examples and the comparative examples. In Table 1, the "temporal change of SNR" is also indicated, by the ratio (%) of the SNR difference between before and after the high-temperature, high-humidity treatment to the SNR before the high-temperature treatment.

TABLE 1

| | Mask material | Electromagnetic conversion characteristics | | Characteristics after high-temperature, high-humidity | | | |
|---|---|---|---|---|---|---|---|
| | | Coercive force (Oe) | SNR (dB) | Coercive force (Oe) | Temporal change of coercive force | SNR (dB) | Temporal change of SNR |
| Example 1 | Pt | 4695 | 14.6 | 4645 | 1.1% | 14.3 | 2.1% |
| Example 2 | Ru | 4754 | 14.6 | 4695 | 1.2% | 14.3 | 2.1% |
| Example 3 | Pd | 4723 | 14.7 | 4681 | 0.9% | 14.4 | 2.0% |
| Example 4 | $Pt_{50}Ru$ | 4719 | 13.2 | 4670 | 1.0% | 13.0 | 1.5% |
| Comparative Example 1 | Ta | 4700 | 13.6 | 4395 | 6.5% | 12.9 | 5.1% |
| Comparative Example 2 | W | 4690 | 13.9 | 4388 | 6.4% | 13.0 | 6.5% |
| Comparative Example 3 | Si | 4744 | 14.0 | 4234 | 10.8% | 13.2 | 5.7% |
| Comparative Example 4 | $SiO_2$ | 4756 | 14.1 | 4366 | 8.2% | 13.4 | 5.0% |
| Comparative Example 5 | $Ta_2O_5$ | 4711 | 14.4 | 4400 | 6.6% | 13.8 | 4.2% |
| Comparative Example 6 | Re | 4723 | 14.5 | 4534 | 4.0% | 14.0 | 3.4% |
| Comparative Example 7 | Mo | 4730 | 14.4 | 4510 | 4.7% | 13.3 | 3.5% |
| Comparative Example 8 | Ti | 4721 | 14.6 | 4454 | 5.7% | 13.8 | 5.5% |
| Comparative Example 9 | V | 4733 | 14.2 | 4212 | 11.0% | 13.5 | 4.9% |
| Comparative Example 10 | Nb | 4693 | 13.9 | 4159 | 11.4% | 13.3 | 4.3% |
| Comparative Example 11 | Sn | 4689 | 13.8 | 4056 | 13.5% | 13.1 | 5.1% |
| Comparative Example 12 | Ga | 4734 | 13.6 | 3960 | 16.3% | 12.9 | 5.1% |
| Comparative Example 13 | Ge | 4744 | 13.9 | 3890 | 18.0% | 12.8 | 7.9% |
| Comparative Example 14 | As | 4729 | 14.1 | 3600 | 23.9% | 13.3 | 5.7% |
| Comparative Example 15 | Ni | 4743 | 13.7 | 4512 | 4.9% | 13.1 | 4.4% |

Table 1 shows that as a result of comparison with Comparative Examples 1 to 15, the high electromagnetic conversion characteristics of the magnetic recording media of Examples 1 to 4 manufactured according to the present invention were less reduced over time, even when the medium is used under a high-temperature, high-humidity environment. Specifically, the coercive force of the magnetic recording medium of each of Examples 1 to 4 changed only by about 1%, and the SNR thereof changed only by about 2%. In addition, Examples 1, 2 and 4 show that the electromagnetic conversion characteristics are stable regardless of whether the mask layer is made of a metal of a single element composition, such as Pt or Ru, or made of an alloy of these elements.

In contrast, the coercive force of the magnetic recording media of the comparative examples changed by 4.0% to 23.9%, and the SNR thereof changed by 3.4% to 7.9%. This indicates that even when magnetic recording media are produced using a mask layer made of a chemically stable material, the electromagnetic conversion characteristics of the resulting magnetic recording media may significantly degrade over time, depending on the material of the mask layer. The degree of the temporal degradation exponentially increases with time. Therefore, the difference between the stabilities of the electromagnetic conversion characteristics of Examples 1 to 4 and Comparative Examples 1 to 15 can be determined to be significantly large.

INDUSTRIAL APPLICABILITY

As described above, in the method of the present invention for manufacturing a magnetic recording medium having magnetically separated magnetic recording patterns, a material including at least one element selected from the element group of Pt, Ru, and Pd is used to form the mask layer. Therefore, the magnetic recording medium manufactured according to the present invention has excellent separation performance of magnetic recording pattern, is not influenced by signal interference between adjacent patterns, and has high recording density characteristics.

As compared with conventional media, the magnetic recording medium of the present invention has improved magnetic recording/reproducing characteristics, which are less degraded over time, even when the medium is used under a high-temperature, high-humidity environment. Therefore, the magnetic recording and reproducing apparatus having the magnetic recording medium of the present invention can be stably used even in high-temperature, high-humidity environment applications such as car navigation applications.

The invention claimed is:

1. A method for manufacturing a magnetic recording medium having magnetically separated magnetic recording patterns, comprising:
    forming a continuous recording layer on a nonmagnetic substrate;
    then forming, on the recording layer, a mask layer comprising at least one element selected from the element group of Pt, Ru, and Pd in such a manner that part of the recording layer is not masked;
    then performing a magnetic characteristic modifying process comprising a first step of exposing the unmasked part of the surface of the recording layer to reactive plasma containing oxygen and oxygen ions; and
    a second step of then exposing the part to reactive plasma containing halogen and halide ions,
    wherein magnetically separated magnetic recording patterns are formed by the magnetic characteristic modifying process.

2. The method for manufacturing a magnetic recording medium according to claim 1, wherein the magnetization of the recording layer modified by the magnetic characteristic modifying process is 75% or less of the original magnetization.

3. The method for manufacturing a magnetic recording medium according to claim 1, wherein the part of the recording layer exposed to halogen and halide ions is substantially free of a halide of a material that forms the recording layer.

4. The method for manufacturing a magnetic recording medium according to claim 1, further comprising implanting ions into the unmasked part of the surface of the recording layer before the magnetic characteristic modifying process.

5. The method for manufacturing a magnetic recording medium according to claim 4, wherein the implanted ions has a composition consisting of one kind or two kinds selected only from argon and nitrogen ions.

6. The method for manufacturing a magnetic recording medium according to claim 1, wherein the halide ions are formed by introducing at least one halogen gas selected from the group of $CF_4$, $SF_6$, $CHF_3$, $CCl_4$, and KBr into reactive plasma.

7. The method for manufacturing a magnetic recording medium according to claim 1, wherein the halide ions are F ions.

* * * * *